(12) United States Patent
Moore et al.

(10) Patent No.: US 8,749,981 B2
(45) Date of Patent: Jun. 10, 2014

(54) MOUNTING BASE FOR CIRCUIT BOARDS

(75) Inventors: Christopher Todd Moore, Salem, VA (US); Drew Miller, Salem, VA (US)

(73) Assignee: General Electric Company, Schenectady, NY (US)

( * ) Notice: Subject to any disclaimer, the term of this patent is extended or adjusted under 35 U.S.C. 154(b) by 155 days.

(21) Appl. No.: 13/357,281

(22) Filed: Jan. 24, 2012

(65) Prior Publication Data
US 2013/0188320 A1  Jul. 25, 2013

(51) Int. Cl.
*H05K 7/20* (2006.01)

(52) U.S. Cl.
USPC ........... 361/721; 361/704; 361/707; 361/709; 165/185

(58) Field of Classification Search
USPC ................. 361/676–678, 720–721, 704, 707, 361/709–710; 165/185
See application file for complete search history.

(56) References Cited

U.S. PATENT DOCUMENTS

| | | | |
|---|---|---|---|
| 4,769,557 A | | 9/1988 | Houf et al. |
| 5,065,278 A | * | 11/1991 | Schultz .......................... 361/688 |
| 5,134,545 A | * | 7/1992 | Smith ........................... 361/712 |
| 5,598,322 A | * | 1/1997 | Von Arx et al. ............... 361/704 |
| 5,635,827 A | * | 6/1997 | Judd et al. ...................... 323/321 |
| 6,125,038 A | * | 9/2000 | Amaro et al. .................. 361/704 |
| 6,141,211 A | * | 10/2000 | Strickler et al. .......... 361/679.31 |
| 6,891,725 B2 | * | 5/2005 | Derksen ........................ 361/704 |
| 6,903,936 B2 | * | 6/2005 | Lin ............................... 361/752 |
| 7,170,751 B2 | * | 1/2007 | Mayer .......................... 361/719 |
| 7,499,261 B2 | * | 3/2009 | Hash ............................ 361/625 |
| 2005/0006053 A1 | * | 1/2005 | Apfelbacher et al. ........ 165/80.2 |

FOREIGN PATENT DOCUMENTS

| | | | | |
|---|---|---|---|---|
| EP | 0145380 A2 | | 6/1985 | |
| EP | 0476322 A1 | | 3/1992 | |
| JP | 2000252661 A | * | 9/2000 | ............... H05K 7/20 |

* cited by examiner

*Primary Examiner* — Robert J Hoffberg
(74) *Attorney, Agent, or Firm* — Sutherland Asbill & Brennan LLP

(57) ABSTRACT

Systems, methods, and apparatus are provided for a mounting base for circuit board assemblies that provides both mounting of one or more circuit boards and a pathway including one or more fins to conduct heat away from the one or more circuit boards.

18 Claims, 4 Drawing Sheets

MOUNTING BASE FOR CIRCUIT BOARDS

FIELD OF THE INVENTION

This invention generally relates to mounting bases for circuit boards, and in particular to systems, methods, and apparatus for cooling circuit board assemblies.

BACKGROUND OF THE INVENTION

Electronic control systems such as power plant control systems may include several control circuit boards, each with both active and passive devices thereon and further mounted to a mounting base. Several mounting bases, each with circuit board assemblies attached thereon, can further be mounted to a rail, such as a DIN rail. Typically the mounting is via mounting elements on the mounting bases. In such a configuration, the mounting bases and, therefore, the circuit boards are mounted in a linear fashion along the DIN rail. This allows for relatively dense packing of electronic control elements in a convenient form factor. The control systems may further be packaged in an enclosure.

The relatively high density of electrical components in these control systems may result in relatively high operating temperatures of the control systems, especially within the enclosures. There may also be relatively hot spots in proximity of active electronic devices on one or more of the circuit boards of the control systems, where it may be difficult to effectively remove heat. Such thermal considerations, in particular the relatively high operating temperatures, may have an overall bearing on the reliability and operating lifetime of the control systems. The thermal considerations may additionally have a bearing on the minimum form factor to which the systems can be designed, the maximum operating speeds, and the overall performance of the control systems.

In conventional mounting bases, heat generated by active and passive components on circuit boards may flow along the circuit boards, to the mounting bases, and then to the DIN rail via mounting elements, primarily by a thermal conduction mechanism.

BRIEF SUMMARY OF THE INVENTION

Certain embodiments of the invention can provide systems, methods, and apparatus for cooling of circuit board assemblies. Embodiments of the invention can further include circuit board mounting bases with fins that enhance cooling of circuit board assemblies mounted thereon. In one aspect, the cooling of circuit board assemblies of a control system can be enhanced via convection processes to extract heat from the fins to the environment surrounding the fins. Therefore, certain embodiments may provide both a convective and a conductive mechanism for removing thermal energy from circuit board assemblies. In another aspect, the circuit board mounting base can provide both a mechanical mounting for circuit board assemblies within a control system, such as to a DIN rail, and a thermal path for conducting heat away from the circuit board assemblies. Enhanced cooling of the circuit board assemblies may enable increasing the density of circuit boards and, in general, electronic components within a control system and decreasing the form factor of the control system. Enhanced cooling may further provide for relatively more reliable operation of the control system and increased operating lifetime.

In one embodiment, a circuit board mounting base can include a first side and a second side, at least one card guide extending from the first side, at least one fin extending from the second side, and at least one mounting element extending from one of the first side or the second side. Furthermore, the at least one card guide can conduct thermal energy from the first side to the second side, the at least one fin can conduct thermal energy away from the second side, and the at least one mounting element can hold the mounting base to a mounting rail.

In another embodiment, a circuit board mounting system can include a mounting rail and at least one mounting base provided on the mounting rail. Each of the at least one mounting base can further include a first side and a second side, at least one card guide extending from the first side, at least one fin extending from the second side, and, at least one mounting element extending from one of the first side or the second side. The at least one card guide can conduct thermal energy from the first side to the second side, the at least one fin can conduct thermal energy away from the second side, and the at least one mounting element can hold the mounting base to the mounting rail.

In yet another embodiment, a method can include providing a mounting base with a first side and a second side, providing at least one card guide extending from the first side, providing at least one fin extending from the second side, conducting thermal energy from the at least one card guide to the second side, conducting thermal energy from the second side to the at least one fin, and removing thermal energy from the at least one fin.

Other embodiments, features, and aspects of the invention are described in detail herein and are considered a part of the claimed inventions. Other embodiments, features, and aspects can be understood with reference to the following detailed description, accompanying drawings, and claims.

BRIEF DESCRIPTION OF THE FIGURES

Reference will now be made to the accompanying tables and drawings, which are not necessarily drawn to scale, and wherein.

DETAILED DESCRIPTION OF EMBODIMENTS OF THE INVENTION

Embodiments of the invention are described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Embodiments of the invention may provide systems, methods, and apparatus for removing thermal energy from a collection of circuit boards. Embodiments of the invention may further enable improved cooling via both convection cooling and conductive cooling. The improvements may provide reduced temperatures within enclosures containing circuit boards and electronic components. Embodiments of the invention may further provide printed circuit board mounting bases that provide mechanical mounting, electrical connections and pathways, and thermal pathways for extracting heat away from printed circuit boards mounted thereon.

Example embodiments of the invention will now be described with reference to the accompanying figures.

Figure 1:
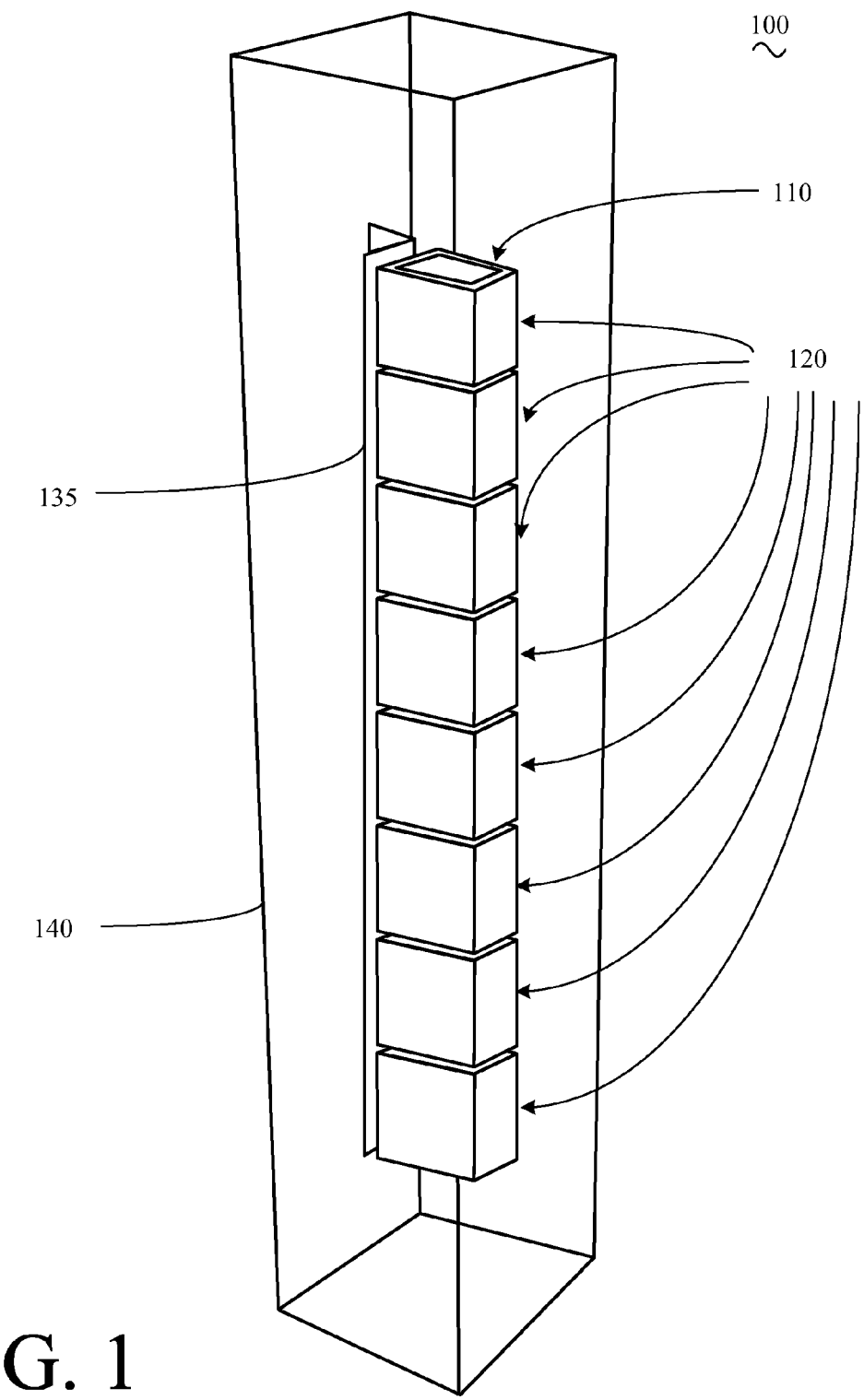
FIG. 1 is a simplified schematic diagram illustrating an example control system according to an embodiment of the invention.
Figure 2:
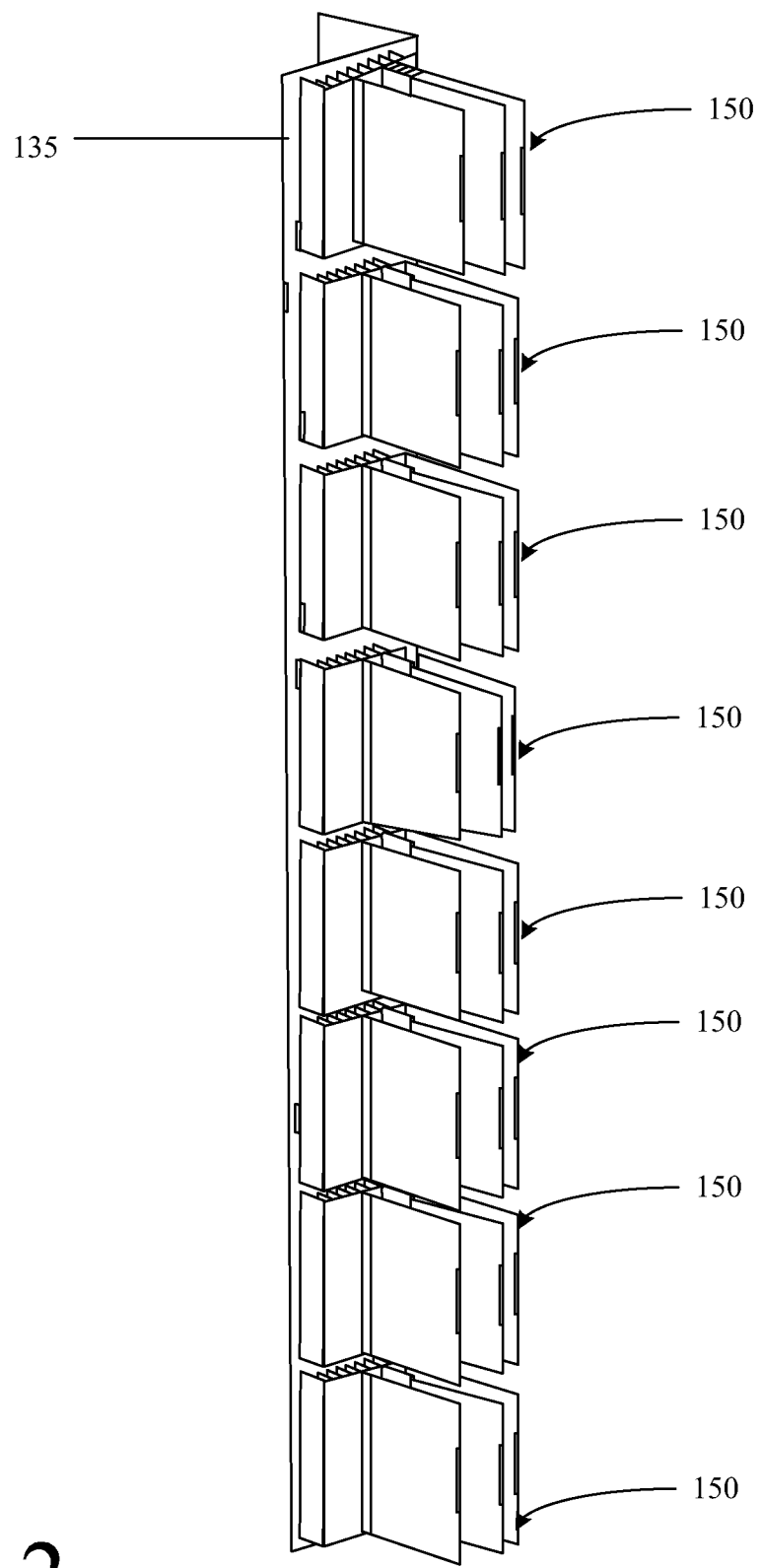
FIG. 2 is a simplified schematic diagram illustrating example circuit board assemblies within the control system of FIG. 1 mounted onto a rail according to an embodiment of the invention.

Referring now to FIGS. 1 and 2, simplified schematic diagrams illustrating an example control system 100 can include a control assembly 110. The control assembly 110 can further include one or more control blocks 120 with each control block 120 mounted to a mounting surface 135. The control system 100 can further include an enclosure 140 containing the constituent control assembly 110. Each of the control blocks 120 can have a mounted assembly 150 contained therein. The mounted assembly 150 can further provide mounting on to the mounting surface 135 with mechanical, electrical, and thermal connections therewith.

During operation, the control system 100 may experience a rise in temperature within its enclosure 140 as a result of electrical power dissipation by the one or more control blocks 120. In particular, constituent electronic devices within the control block 120 can be electrically powered and therefore during operation provide heat within the enclosure 140 of the control system 100.

Figure 3:
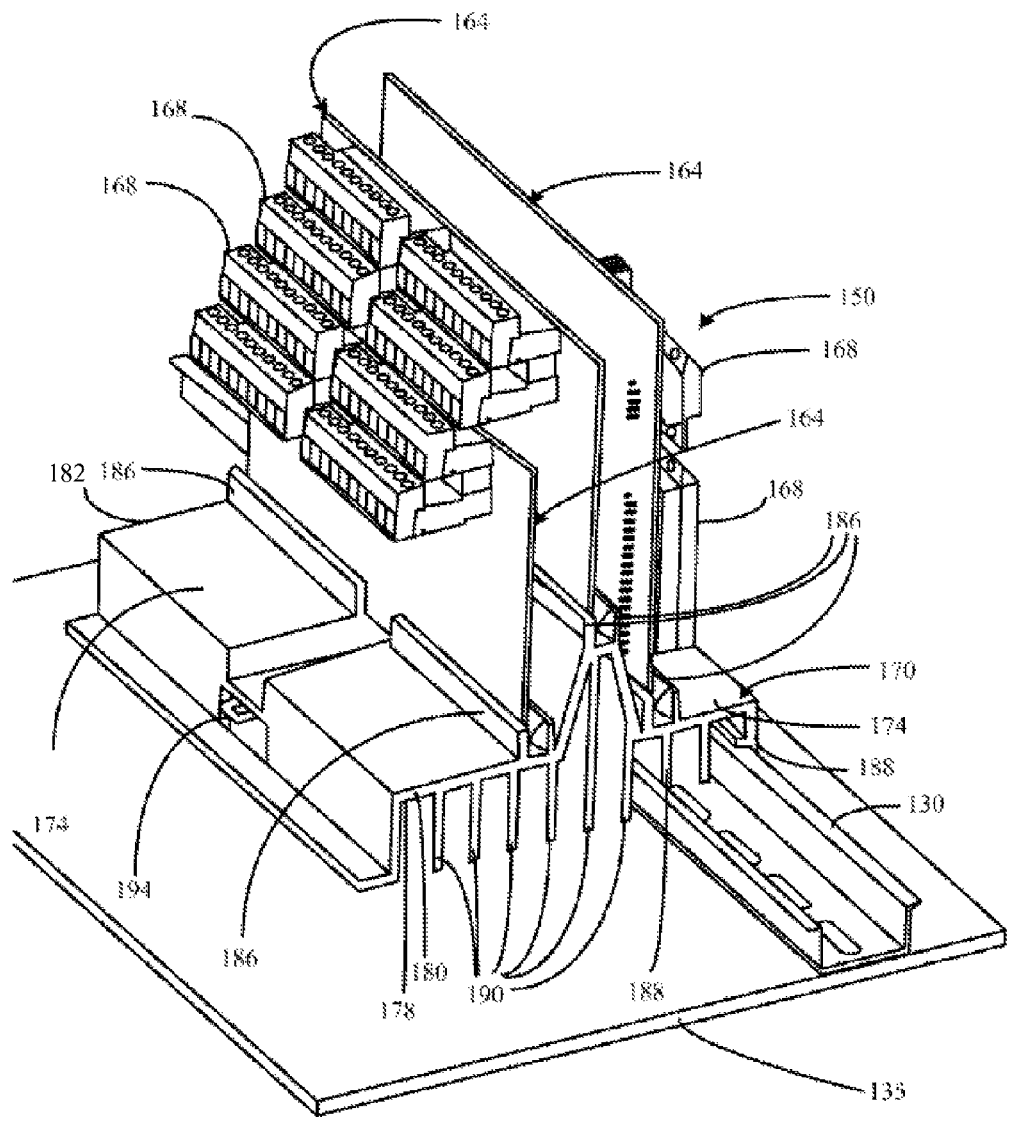
FIG. 3 is a simplified schematic diagram illustrating thermal, electrical, and mechanical features of a circuit board mounting base in the control system of FIG. 1 according to an embodiment of the invention.

Referring now to FIG. 3, an example mounted assembly 150 can include one or more circuit boards 164 mounted onto a mounting base 170. The circuit boards 164 can be of any known type, such as FR-4, laminate boards, multilayer boards, or the like. Each of the circuit boards 164 can have one or more electronic elements 168 connected thereto. The electronic elements 168 can be any type of passive or active elements including, but not limited to, resistors, inductors, capacitors, diodes, transistors, integrated circuits (ICs), logic gates, microcontrollers, microprocessors, digital signal processors, floating point gate arrays, memories, static random access memories, dynamic random access memories, read only memories, cable connectors, jumper connectors, or combinations thereof. One or more of the electronic elements 168 may dissipate electrical energy and therefore generate heat on the circuit boards 164. The circuit boards 164 may further include electrical traces (not shown) for interconnecting the one or more electronic elements. The electrical traces may provide for relatively high thermally conductive pathways along the surface of the circuit boards 164. The electronic elements 168 may be connected to the circuit boards using any known methods including soldering with standard lead-tin (Pb—Sn) solder or reduction of hazardous substance (RoHS) compliant tin-silver-copper (SAC) alloy solder, or the like.

The mounting base 170 can have a first side, shown as a top side 174 and a second side, shown as a bottom side 178. The top side 174 and the bottom side 178 meet at edges 180 and 182 of the mounting base 170. The mounting base 170 may have one or more card guides 186 extending from the top side 174 for providing connection between the mounting base 170 and the circuit boards 164. The mounting base 170 can also include mounting elements 188 extending from the bottom side 178 for mounting the mounting base 170, and thereby the control block 120, onto a mounting rail 130 that is physically attached to the mounting surface 135. The mounting base 170 can further have fins 190 extending from the bottom side 178. Additionally, the mounting base 170 may have a grounding connector 194 for providing electrical grounding to the mounted assembly 150.

The card guides 186 can be of any known type of male or female connectors in accordance with embodiments of the invention. For example, the card guides 186 can be any variety of edge connector types including, but not limited to, peripheral component interconnect (PCI), PCI Express, accelerated graphics port (AGP), or the like. The card guides 186 may further have a spring tension mechanism to effectively hold the circuit boards 164 in place while allowing easy removal of the circuit boards 164. The card guides 186 may further extend out as shown and partially overlap and be in contact with one or both sides of a circuit board 164. Therefore, in some instances, two card guides 186 may be in contact with both sides of the circuit board 164 held therebetween, as well as the edge of the circuit board 164. In other instances, the card guides 186 may only contact either one or both sides of the circuit board 164 or the edge of the circuit board 164.

The card guides 186, in addition to providing mechanical connections, can also provide electrically conductive connections and thermally conductive connections between the circuit boards 164 and the mounting base 170. In one aspect, the circuit boards 164 may have printed electrical traces and connection pads (not shown) that contact corresponding pads or traces (not shown) on the mounting base to provide the primary connections for electrical and thermal purposes between the circuit boards 164 and the mounting base 170.

Certain embodiments of the invention may include "dummy pads" or metallic pad connections between the circuit boards 164 and the mounting base 170 that do not serve the purpose of electrical connectivity therebetween, but does increase thermal conduction therebetween.

In certain embodiments of the invention, the card guides 186 may substantially extend from one edge 180 to the other edge 182 as shown in FIG. 3. In these embodiments one or more of the circuit boards 164 attached the mounting base 170 may also substantially extend from one edge 180 to the other edge 182.

The mounting elements 188 can be of any known type to mount the mounting base 170 to the mounting rail 130 including, but not limited to, top hat mounting, C-type mounting, G-type mounting, or combinations thereof. The mounting elements 188 may substantially extend from one edge 180 to the other edge 182. Alternatively, the mounting elements 188 may only partially extend the length from one edge 180 to the other edge 182.

In certain embodiments, the mounting elements 188 may have a relatively high surface area in contact with the mounting rail 130 and the mounting surface 135 to provide a relatively low thermal resistance therebetween. In other words, a greater thermal conductance may be achieved between the mounting base 170 and the mounting rail 130 and mounting surface 135 if there is a greater area in intimate contact between the same.

The fins 190 extending from the bottom surface 178 may be of any known type. For example, the fins 190 may be of rectangular shape as shown in FIG. 3. In other embodiments, the fins 190 may be tapered, wherein a cross section may be trapezoidal in shape. In yet other embodiments, the fins 190 may have a cross sectional "T" shape. Furthermore, in certain embodiments, the fins 190 may have through holes or perforations. As in the case of the card guides 186 and the mounting elements 188, the fins 190 may or may not substantially extend the length of the mounting base 170 from one edge 180 to the other edge 182. The fins 190 may extend to and make contact with the mounting surface 135. In other words, the fins 190 can both be in contact with the mounting surface 135 and have open space between adjacent fins 190 to allow fluid, such as air, to flow therebetween.

In certain embodiments, the fins 190 may have a relative lateral spacing in the range of about 0.3 cm to 4 cm. The fins 190 may further extend a distance in the range of about 1 cm to about 5 cm from the bottom side 178 of the mounting base 170.

The mounting base 170 may be fabricated by any known method including, but not limited to, die casting or extrusion. In certain embodiments, the mounting base 170 may have a cross section along its length, from one edge 180 to the other edge 182, that varies minimally, thereby enabling low cost extrusion based fabrication thereof. Any known materials may be used to fabricate the mounting base 170 including, but not limited to, metals, ceramics, and polymers. In certain embodiments, the mounting base 170 may be fabricated from metals that exhibit relatively high thermal conductivities and melting temperatures that are not relatively high, such as aluminum, iron, copper, cobalt, nickel, or alloys, intermetallics, or other combinations thereof. Such materials may be particularly amenable to extrusion or die casting fabrication methods while providing a fabricated mounting base 170 constructed from a material with a relatively high thermal conductivity. In other embodiments, the mounting base 170 may be fabricated from more than one type of material.

In operation, the control system 100 may dissipate electrical energy and thereby generate heat, particularly on the circuit boards 164, by the operation of the electronic elements 168 attached thereto. The electronic elements 168 may further provide hot spots, or localized areas in the proximity of certain electronic elements 168 with a temperature relatively greater than surrounding areas. The thermal energy that is provided by the circuit board 164 may be conducted along the length of the circuit board 164 to the card guides 186 holding the circuit board 164. The thermal energy may further be conducted from the card guides 186 to the top side 174 of the mounting base 170 and then on to the bottom side 178 of the mounting base 170. The thermal energy may yet further be conducted from the bottom side 178 of the mounting base 170 to the mounting elements 188 and the fins 190. The portion of the thermal energy conducted to the mounting elements 188 may further be conducted to the mounting surface 135 via the fins 190. The portion of the thermal energy conducted to the fins 190 may further be provided to the ambient surrounding the fins 190 via primarily a thermal convection mechanism. The ambient may be fluid, such as air, surrounding the fins 190. Therefore, the fins 190 can both conduct thermal energy to the mounting surface 135 and provide thermal energy to the surrounding ambient, such as air via convection.

It should be noted that a thermal gradient may exist between each of the elements in the thermal path described above. In other words, there may be a difference in temperature between the circuit board 164, the card guide 186, the top side 174, the bottom side 178, the fins 190, and the ambient. In certain embodiments, the temperature of the circuit board 164 may be greater than the card guide 186, which in turn is greater than the top surface 174, which is further greater than the bottom side 178, which is yet further greater than the fins 190, and the fins 190 may be at a higher temperature than the surrounding ambient and the mounting base 135. Therefore, heat, may be flowing from regions of higher temperature to regions of lower temperature.

The fins 190 and the removal of thermal energy therefrom via both a convective mechanism and an conductive mechanism may provide for a greater thermal gradient upstream of the thermal path described above. The greater thermal gradient as result of providing fins 190 with convective and conductive thermal flow on the mounting base 170 may enhance thermal conduction between elements in the thermal path upstream of the fins 190. In other words, as heat is removed from the fins 190 via convection, a greater thermal gradient develops between the fins 190 and the bottom side 178 than without the fins 190 and the resulting thermal convection process. Since thermally conductive flow depends at least partly on thermal gradient, an increased thermal gradient between the fins 190 and the bottom side 178 results in a greater thermal flow from the bottom side 178 to the fins 190. This, in turn, generates a greater thermal gradient between the bottom side 178 and the top side 174 of the mounting base 170, with a resulting greater thermal flow therebetween. As such, a greater thermal flow downstream in the thermal path results in a greater thermal flow, or heat extraction, upstream in the thermal path.

In one aspect, the mounting base 170 may remove heat from the proximity of the circuit boards 164 and discharge the heat from the mounting base 170 via the fins 190 using both thermal conduction and thermal convection processes. In another aspect, the thermal energy can be transported away from the mounting base 170 via a conduction process from the mounting elements 188 to the mounting rail 130 and the mounting surface 135, as well as a convection process from the fins 190 to the surrounding ambient and a conduction process from the fins 190 to the mounting surface 135. In yet another aspect, the mounting base 170 may provide a lower temperature in the proximity of the circuit boards 164 due to improved thermal conduction from the circuit boards 164 to the card guides 186 due to a greater thermal gradient therebetween, as a result of thermal convection via the fins 190. Additionally, the mounting base 170 may provide a lower temperature at hot spots on the circuit boards 164 due to improved thermal conduction from the circuit boards 164 to the card guides 186 due to a greater thermal gradient therebetween as a result of thermal convection via the fins 190. Further yet, the mounting base 170 can provide both the function of mounting the mounted assembly 150 to the mounting rail 130 and removing heat away from circuit boards 164.

In one aspect, the inclusion of the fins 190 on the mounting base 170 may result in a temperature within the control block 120 of the control system 100 that is between approximately 5 and 20 degrees Celsius less than if the fins 190 were not included during operation.

It should be noted, that the mounted assembly 150 and the mounting base 170 may be modified in various ways in accordance with certain embodiments of the invention. For example, in certain embodiments, elements may be placed and interconnected at different locations relative to other elements on the mounted assembly 150. Additionally, in other embodiments, other elements can be added or removed from the mounted assembly 150.

Figure 4:
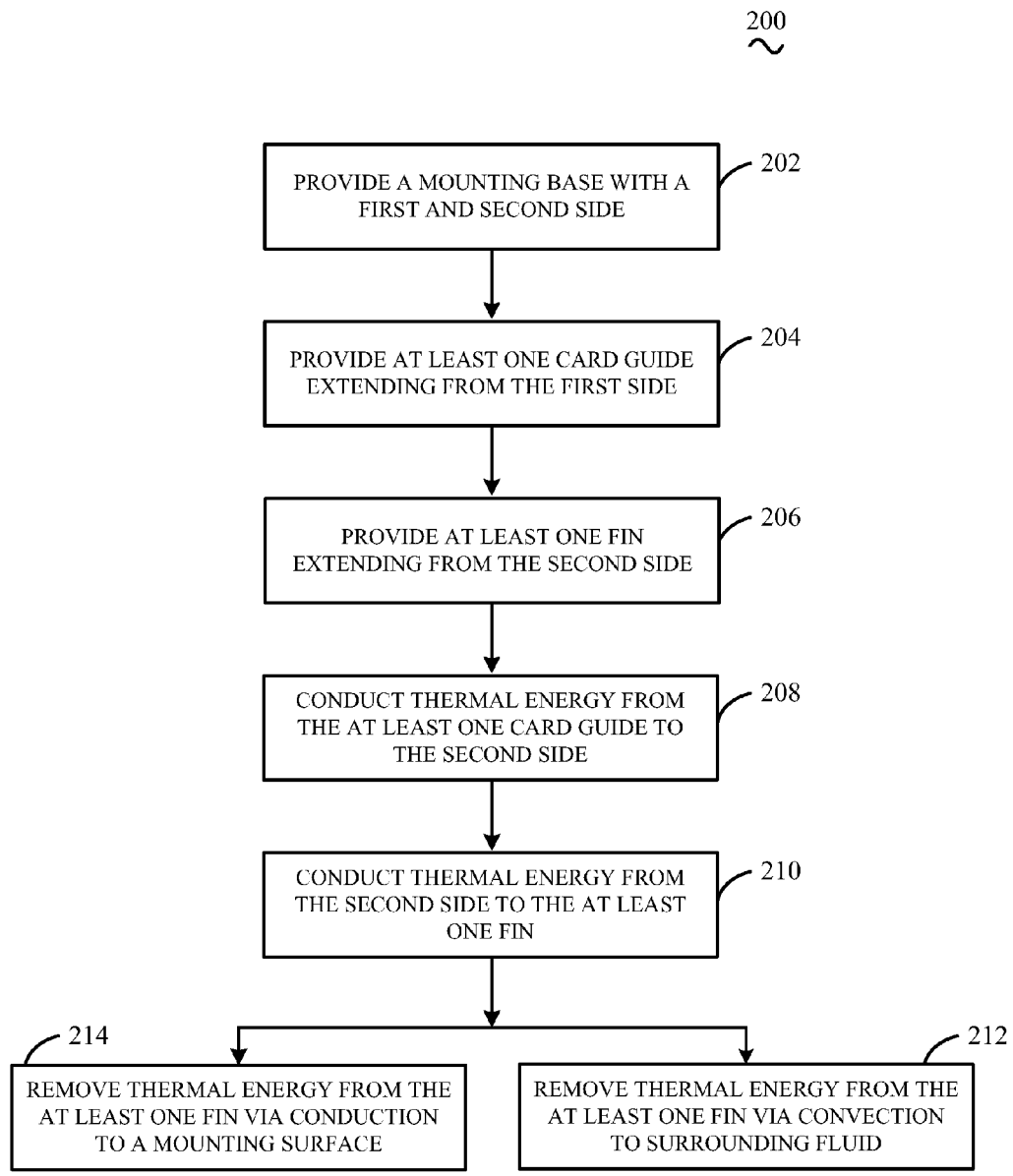
FIG. 4 is a flow diagram of an example method for removing thermal energy from a mounting base according to an embodiment of the invention.

Referring now to FIG. 4, an example method 200 for removing heat from circuit board assemblies is disclosed. At block 202, a mounting base with a first side and a second side is provided. As described with reference to FIG. 3, the mounting base 170 can be constructed from metal and provide a thermal path for heat generated on one side to flow to the other side. At block 204, at least one card guide extending from the first side is provided. As described with reference to FIG. 3, the card guides 186 can provide a mechanical, electrical, and thermal connection between the mounting base 170, and the circuit boards 164 that may be mounted thereon. At block 206, at least one fin extending from the second side of the mounting base is provided. At block 208, thermal energy is conducted from the at least one card guide to the second side. At block 210, thermal energy is conducted from the second side to the at least one fin. At block 208 and 210, thermal energy that may have been generated at a circuit board 164 may flow down a thermal gradient, first to the card guides 186 and then to the second (bottom) side 178 of the mounting base 170 and subsequently to the fins 190 extending from the second side 178. The primary mode of this thermal energy transfer may be via conduction. At block 212, thermal energy from the at least one fin is removed via convection. At block 214, thermal energy from the at least one fin is removed via conduction. The removal of thermal energy from the fins 190 may, therefore, be via both thermal convection to the ambient surrounding the fins 190, such as air or other fluids surrounding the fins 190, and thermal conduction to the mounting surface 135.

It should be noted, that the method 200 may be modified in various ways in accordance with certain embodiments of the invention. For example, one or more operations of the method 200 may be eliminated or executed out of order in other embodiments of the invention. Additionally, other operations may be added to the method 200 in accordance with other embodiments of the invention.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A mounted assembly comprising:
   a mounting surface;
   a mounting rail provided on the mounting surface;
     a circuit board mounting base comprising:
     a first side and a second side;
     at least one card guide extending from the first side;
     at least one fin extending from the second side, wherein the at least one fin is in direct contact with the mounting surface; and,
     at least one mounting element extending from one of the first side or the second side,
   wherein the at least one card guide conducts thermal energy from the first side to the second side, the at least one fin conducts the thermal energy away from the second side to the mourning surface and to an ambient surrounding the at least one fin, and the at least one mounting element holds the mounting base to the mounting rail and conducts the thermal energy to the mounting rail.

2. The mounted assembly of claim 1, further comprising a first edge that is shared by the first and second sides and a second edge that is shared by the first and second sides, wherein the first and second edges are on distal ends of the first and second sides and the at least one fin extends from first edge to the second edge.

3. The mounted assembly of claim 2, wherein the at least one card guide extends from the first edge to the second edge.

4. The mounted assembly of claim 1, further comprising a circuit board mounted in one or more of the at least one card guide.

5. The mounted assembly of claim 4, wherein the thermal energy generated in the circuit board is conducted to the one or more of the at least one card guide.

6. The mounted assembly of claim 1, wherein the at least one fin extends in a perpendicular direction relative to the second side.

7. The mounted assembly of claim 1, wherein the at least one fin loses the thermal energy by convection to the ambient surrounding.

8. The mounted assembly of claim 1, further comprising a grounding point for providing an electrical ground reference connection to the mounting base.

9. A mounted assembly system comprising:
   a mounting surface;
   a mounting rail provided on the mounting surface; and,
   at least one mounting base provided on the mounting surface and the mounting rail, each of the at least one mounting base comprising:
     a first side and a second side;
     at least one card guide extending from the first side;
     at least one fin extending from the second side, wherein the at least one fin is in direct contact with a mounting surface; and,
     at least one mounting element extending from one of the first side or the second side,
   wherein the at least one card guide conducts thermal energy from the first side to the second side, the at least one fin conducts the thermal energy away from the second side to the mounting surface and to an ambient surrounding the at least one fin, and the at least one mounting element holds the mounting base to the mounting rail and conducts the thermal energy to the mounting rail.

10. The system of claim 9, further comprising a circuit board mounted in one or more of the at least one card guide.

11. The system of claim 10, wherein the thermal energy generated in the circuit board is conducted to the one or more of the at least one card guide.

12. The system of claim 9, wherein the at least one fin loses the thermal energy by convection to the ambient surrounding.

13. The system of claim 9, further comprising a grounding point for providing an electrical ground reference connection to the mounting base.

14. A method comprising:
   providing a mounting surface;
   providing a mounting rail on the mounting surface;
   providing a mounting base with a first side and a second side;
   providing at least one card guide extending from the first side;
   providing at least one fin extending from the second side, wherein the at least one fin is in direct contact with the mounting surface;
   providing at least one mounting element extending from one of the first side or the second side, the at least one mounting element mounting to the mounting rail;
   conducting thermal energy from the at least one card guide to the second side;

conducting the thermal energy from the second side to the at least one fin;

conducting the thermal energy from the second side to the at least one mounting element;

removing the thermal energy from the at least one fin to the mounting surface and to an ambient surrounding the at least one fin.

15. The method of claim 14, further comprising providing a circuit board mounted in one or more of the at least one card guide.

16. The method of claim 15, further comprising conducting the thermal energy generated in the circuit board to the one or more of the at least one card guide.

17. The method of claim 14, wherein removing the thermal energy from the at least one fin is by convection to the ambient surrounding.

18. The method of claim 14, further comprising providing a grounding point for electrical ground reference connection to the mounting base.

* * * * *